(12) United States Patent
Mun

(10) Patent No.: US 7,893,465 B2
(45) Date of Patent: Feb. 22, 2011

(54) SEMICONDUCTOR DEVICE AND METHOD OF MANUFACTURING SAME

(75) Inventor: Chear-Yeon Mun, Yongin-si (KR)

(73) Assignee: Samsung El;ectronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 12/858,715

(22) Filed: Aug. 18, 2010

(65) Prior Publication Data

US 2010/0308433 A1 Dec. 9, 2010

Related U.S. Application Data

(62) Division of application No. 11/774,642, filed on Jul. 9, 2007, now Pat. No. 7,799,617.

(30) Foreign Application Priority Data

Jul. 10, 2006 (KR) .................. 10-2006-0064254

(51) Int. Cl.
*H01L 23/52* (2006.01)

(52) U.S. Cl. ............... 257/209; 257/529; 257/E23.149
(58) Field of Classification Search ............... 257/209, 257/528, 529, 665, E23.149
See application file for complete search history.

(56) References Cited

U.S. PATENT DOCUMENTS

| 6,864,124 | B2 | 3/2005 | Lee et al. | |
| 7,579,266 | B2 * | 8/2009 | Sakoh | ............ 438/601 |
| 2003/0168715 | A1 | 9/2003 | Bae | |
| 2005/0156276 | A1 * | 7/2005 | Sakoh | ............ 257/529 |
| 2006/0030083 | A1 | 2/2006 | Wu | |
| 2008/0081454 | A1 * | 4/2008 | Sakoh | ............ 438/601 |

FOREIGN PATENT DOCUMENTS

KR 1020020017311 A 3/2002

* cited by examiner

*Primary Examiner*—Lex Malsawma
(74) *Attorney, Agent, or Firm*—Volentine & Whitt, PLLC

(57) ABSTRACT

A semiconductor device includes an etching protection layer to protect a metal layer in a bonding pad area when a metal fuse is etched.

9 Claims, 13 Drawing Sheets

SEMICONDUCTOR DEVICE AND METHOD OF MANUFACTURING SAME

CROSS-REFERENCE TO RELATED APPLICATIONS

This is a divisional of application Ser. No. 11/774,642 filed on Jul. 9, 2007, which claims the priority of Korean Patent Application No. 10-2006-0064254, filed on Jul. 10, 2006, the disclosures of which are hereby incorporated by reference in their entirety.

BACKGROUND OF THE INVENTION

1. Field of the Invention

Embodiments of the invention relate generally to semiconductor devices and related methods of manufacture. More particularly, embodiments of the invention relate to semiconductor devices including a thin metal fuse and a thick metal bonding pad and methods for manufacturing the semiconductor devices.

2. Description of Related Art

Semiconductor devices are generally manufactured through several procedures performed in a sequence. These procedures may include, for example, fabrication (FAB) processes, electrical die sorting (EDS) processes, assembly processes, and test processes.

In a typical FAB process, a crystal ingot of semiconductor materials is sliced into a wafer, and various unit processes such as a diffusion process, a photolithography process, an etching process, and a deposition process for a thin layer are sequentially and repeatedly performed on the wafer to form electrical circuits.

After the FAB process, an EDS process is performed to inspect the wafer for processing defects such as defects affecting the electrical circuits. The EDS process typically comprises a pre-laser test, a laser repair process, a post-laser test and a back-grinding process. In the pre-laser test, each chip of the wafer is inspected for defects and electrical failure data is generated for any detected defects.

Next, in the laser repair process, repairable processing defects are corrected in accordance with the electrical failure data. Then, in the post-laser test process, some repaired dies on the wafer are selected and the selected dies are further inspected for defects. Finally, in the back-grinding process, a back or rear surface of the wafer is polished by a polishing unit such as a diamond wheel.

In the above-mentioned laser repair process, a fuse connected to a memory cell including detected defects, i.e., a "defective cell", is cut by a laser, and the defective cell is replaced with a redundant cell within the same chip. By cutting the fuse, the laser repair process forces the defective cell to be electrically inactive and causes the redundant cell to be electrically active.

Conventionally, a bit line comprising polysilicon has been used as the fuse in a fuse box when the repairing process is performed by the laser repair process. However, due to the high integration density of contemporary semiconductor devices, several metal wirings are often stacked on or over the bit line. Accordingly, the metal wirings on the bit line are etched from the fuse box in the laser repair process to use the polysilicon bit line as the fuse.

Unfortunately, there may be many difficulties in forming the polysilicon fuse in the fuse box. In addition, the polysilicon fuse may be positioned so far below a top surface of the metal wirings that the laser repair process will require a high powered laser, and a nib end portion of the laser will be dispersed, potentially damaging a silicon wafer including the fuse.

For at least these reasons, when a semiconductor device has multilayer metal wirings, a barrier metal layer of a topmost metal wiring or a next topmost metal wiring has been used as the polysilicon fuse. However, where the barrier metal layer of the topmost metal wiring is used as the fuse, both the fuse and a bonding pad must be formed by a photolithography process using the same topmost metal wiring as an etching mask. As a result, the process for manufacturing the polysilicon fuse can be relatively complicated.

FIGS. 1A through 1C are cross-sectional views illustrating a conventional method of manufacturing a semiconductor device including a fuse located in a next topmost metal wiring of a semiconductor wafer. More particularly, FIG. 1A illustrates a portion of the semiconductor device in which core and peripheral circuits are formed; FIG. 1B illustrates a fuse box of the semiconductor device; and FIG. 1C illustrates a bonding pad area of the semiconductor device.

Referring to FIGS. 1A through 1C, a memory cell (not shown) or at least one wiring structure is formed on a semiconductor substrate 10 such as a wafer. Silicon oxide is deposited onto substrate 10 to form an insulation layer 12.

A first barrier layer 14 comprising titanium (Ti) or titanium nitride (TiN), a first metal layer 16 comprising aluminum (Al) and a first capping layer 18 comprising titanium (Ti) or titanium nitride (TiN) are sequentially formed on insulation layer 12. Then, first capping layer 18, first metal layer 16 and first barrier layer 14 are sequentially patterned using a photolithography process to form a first metal wiring 20a. First metal wiring 20a includes a next topmost metal wiring and a metal fuse 20b.

Silicon oxide is deposited onto first metal wiring 20a, metal fuse 20b, and insulation layer 12, so that a first inter-metal dielectric (IMD) layer 22 is formed on insulation layer 12 to a sufficient thickness to cover first metal wiring 20a and metal fuse 20b. First IMD 22 is then partially removed from insulation layer 12 by a photolithography process to form a via hole 24 through which first metal wiring 20a is partially exposed.

A second barrier layer 26 comprising titanium (Ti) or titanium nitride (TiN) is formed on a surface of first inter-metal dielectric layer 22 and on sidewalls and bottom of via hole 24. A second metal layer 28 is formed on second barrier layer 26 in such process that via hole 24 is filled with metal layer 28 and a top surface of metal layer 28 is planarized. A second capping layer 30 comprising titanium (Ti) or titanium nitride (TiN) is formed on metal layer 28. Then, second capping layer 30, metal layer 28 and second barrier layer 26 are sequentially patterned using a photolithography process to form a second metal wiring 32a. Second metal wiring 32a makes electrical contact with first metal wiring 20a through via hole 24 and includes a topmost metal wiring and a bonding pad 32b.

Silicon oxide is deposited onto second metal wiring 32a, bonding pad 32b, and insulation layer 12, so that a second inter-metal dielectric layer 34 is formed on insulation layer 12 to a sufficient thickness to cover second metal wiring 32a and bonding pad 32b. Silicon nitride is deposited onto second inter-metal dielectric layer 34 to form a third inter-metal dielectric layer 36 on second inter-metal dielectric layer 34.

Third inter-metal dielectric layer 36, second inter-metal dielectric layer 34, and first inter-metal dielectric layer 22 are sequentially and partially removed from substrate 10 until top surfaces of metal fuse 20b and bonding pad 32b are exposed, thereby forming an opening 38 through which a fuse box and a bonding pad area are exposed.

Metal fuse 20b exposed through opening 38 is partially etched until first metal layer 16 of metal fuse 20b remains on first barrier layer 14 with a thickness of about 3000 Å. As a result, metal fuse 20b includes barrier layer 14 and first metal layer 16.

When first metal layer 16 of metal fuse 20b is partially etched, second capping layer 30 and metal layer 28 of bonding pad 32b, which are exposed through opening 38, are also partially etched so that bonding pad 32b includes second barrier layer 26 and metal layer 28. Accordingly, a thickness reduction of metal fuse 20b is performed by an etching process against first metal layer 16 of metal fuse 20b after opening 38 is formed.

Where a thickness of metal fuse 20b is excessively large, there is a problem that a first fuse connected to a defective cell may be difficult to cut using a laser during the laser repair process. Where the electrical power of the laser is increased to cut thick metal fuse 20b, there is a possibility that a second fuse connected to a non-defective cell adjacent to the defective cell may also be cut. However, the partial etching of metal fuse 20b against first metal layer 16 allows metal fuse 20b to have a small thickness such that an allowable error range of the laser repair process may be improved.

Unfortunately, because both the fuse box and the bonding pad area are simultaneously exposed through opening 38, metal layer 28 of bonding pad 32b is simultaneously etched with first metal layer 16 of metal fuse 20b by the same amount as first metal layer 16. As result, a thickness of bonding pad 32b also decreases in proportion to the reduction of metal fuse 20b, as indicated by the letter "A" in FIG. 1C.

A metal layer of the bonding pad requires a sufficient thickness to securely bond balls (e.g., solder balls) to the bonding pad in a packaging process for a semiconductor device to thereby ensure sufficient adherence between the balls and the bonding pad.

As a result, the excessive etching against metal layer 28 of bonding pad 32b reduces the thickness of bonding pad 32b. As a result, bonding pad 32b may have insufficient metal for a bonding agent between the balls and the bonding pad. Accordingly, the adherence force between the balls and the bonding force may be reduced and the balls may be undesirably separated from the bonding pad.

SUMMARY OF THE INVENTION

Accordingly, selected embodiments of the invention provide semiconductor devices including a metal fuse having a relatively small thickness and a bonding pad having a relatively large thickness.

According to one embodiment of the invention, a semiconductor device, comprises a semiconductor substrate, a first conductive structure, a metal fuse, a first IMD layer, a via hole, a second conductive structure, and a second IMD layer. The semiconductor substrate has a bonding pad area and a fuse area. The first conductive structure is formed on the substrate and has a thickness and a top surface and comprising a first metal layer. The metal fuse is formed on the substrate in the fuse area and has a thickness smaller than the thickness of the first conductive structure and a top surface coplanar with the top surface of the first conductive structure. The first IMD layer covers the first conductive structure and the metal fuse. The via hole is formed through the first IMD layer such that the first conductive structure is partially exposed through the via hole. The second conductive structure is formed on the first IMD layer over the substrate and is electrically connected to the first conductive structure through the via hole. The second conductive structure comprises a second metal layer and an etching prevention layer formed over the second metal layer on areas of the substrate other than the bonding pad area but not in the bonding pad area. The second IMD layer is formed on the first IMD layer. The second IMD layer covers the second conductive structure and includes an opening through which the fuse area and the bonding pad area are exposed through the first IMD layer.

According to another embodiment of the invention, a method of manufacturing a semiconductor device is provided. The method comprises forming a first conductive structure comprising a first metal layer and a metal fuse on a semiconductor substrate, wherein the semiconductor substrate has a bonding pad area and a fuse area and the metal fuse is formed in the fuse area. The method further comprises forming a first inter-metal dielectric (IMD) layer covering the first conductive structure and the metal fuse, partially removing the first IMD layer to form a via hole through which the first conductive structure is partially exposed, forming a second conductive structure on the first IMD layer to fill the via hole, wherein the second conductive structure comprises a second metal layer and an etching prevention layer formed on the second metal layer, forming a second IMD layer on the first IMD layer, wherein the second IMD layer covers the second conductive structure, partially removing the second IMD layer and the first IMD layer to form an opening exposing the fuse area and the bonding pad area, and partially etching the metal fuse to reduce a thickness of the metal fuse while protecting the second metal layer with etching prevention layer.

According to another embodiment of the invention, a method of manufacturing a semiconductor device is provided. The method comprises forming a first conductive structure including a first metal layer and a metal fuse on a semiconductor substrate having a bonding pad area and a fuse area, wherein the metal fuse is formed in the fuse area, forming a first inter-metal dielectric (IMD) layer covering the first conductive structure and the metal fuse, partially removing the first IMD layer to form a via hole through which the first conductive structure is partially exposed, forming a second conductive structure on the first IMD layer to fill the via hole, wherein the second conductive structure comprises a second metal layer and an etching prevention layer formed on the second metal layer, forming a second IMD layer on the first IMD layer, wherein the second IMD layer covers the second conductive structure, forming a passivation layer on the second IMD layer, the passivation layer comprising photosensitive polyimide, sequentially and partially removing the passivation layer, the second IMD layer and the first IMD layer to form an opening exposing the fuse area and the bonding pad area, and partially etching the metal fuse to reduce its thickness while protecting the second metal layer using the etching prevention layer.

BRIEF DESCRIPTION OF THE DRAWINGS

Embodiments of the invention are described in this written description with reference to the accompanying drawings. Throughout the drawings like reference numbers indicate like exemplary elements, components, or steps. In addition, the relative dimensions of different features may be skewed or exaggerated in the drawings for clarity of illustration. In the drawings.

DESCRIPTION OF EXEMPLARY EMBODIMENTS

Exemplary embodiments of the invention are described below with reference to the corresponding drawings. These embodiments are presented as teaching examples while the actual scope of the invention is defined by the claims that follow.

In this written description, features such as elements, layers, or components may be referred to as being "on," "connected to" or "coupled to" other features. Such features can be directly on, connected or coupled to the other features or intervening elements or layers may be present. However, where a feature is referred to as being "directly on," "directly connected to" or "directly coupled to" another feature, there are substantially no intervening features present—e.g., no intervening layers or components. In addition, features may be identified with specific numbers, e.g., first, second, third, etc. However, these numbers are generally used to distinguish between different features and should not be interpreted per se as requiring a particular ordering, prioritization, or limited number of such features.

Figure 1A:
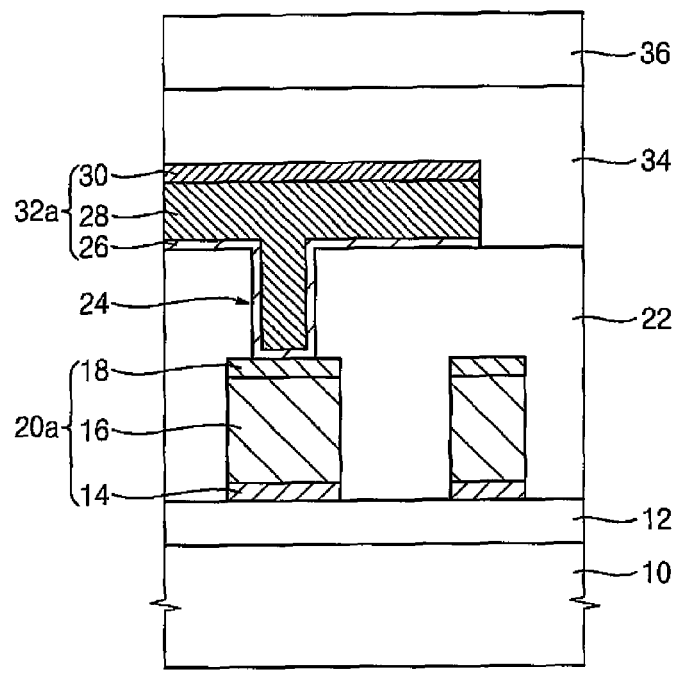
FIGS. 1A through 1C are cross-sectional views illustrating a conventional method of manufacturing a semiconductor device including a fuse located in a next topmost metal wiring.
Figure 1B:
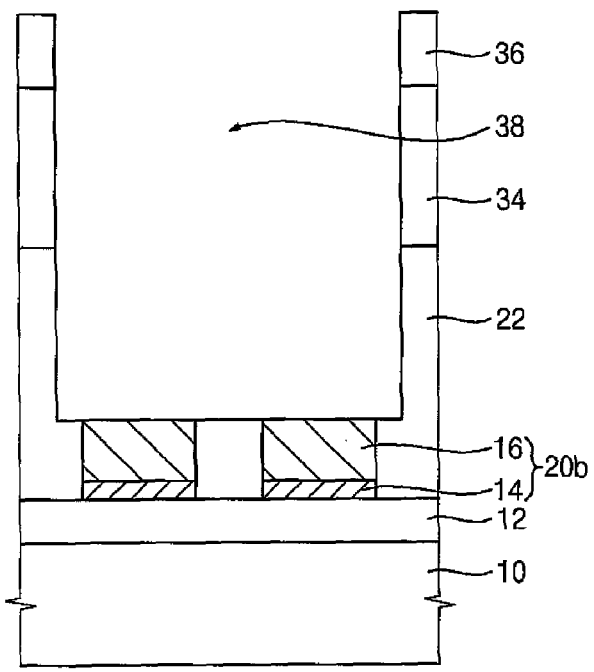
Figure 1C:
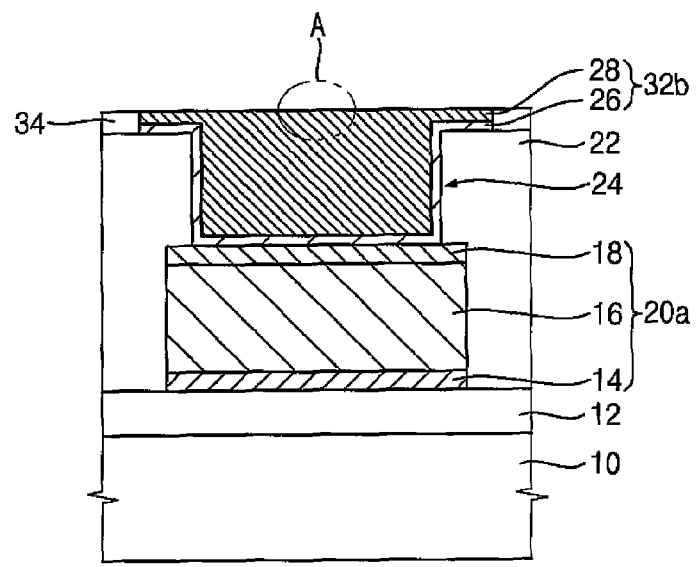
Figure 2A:
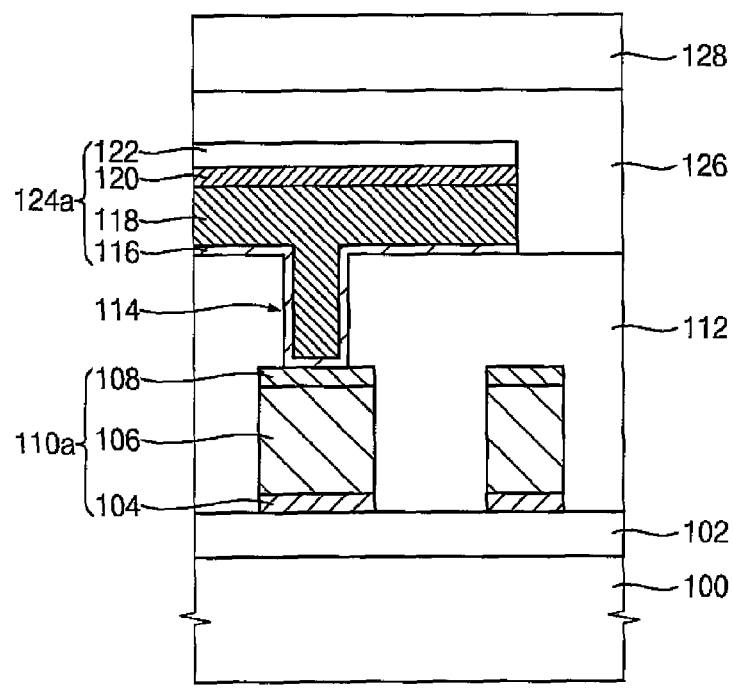
FIGS. 2A through 2C are cross-sectional views illustrating a semiconductor device according to one embodiment of the invention.
Figure 2B:
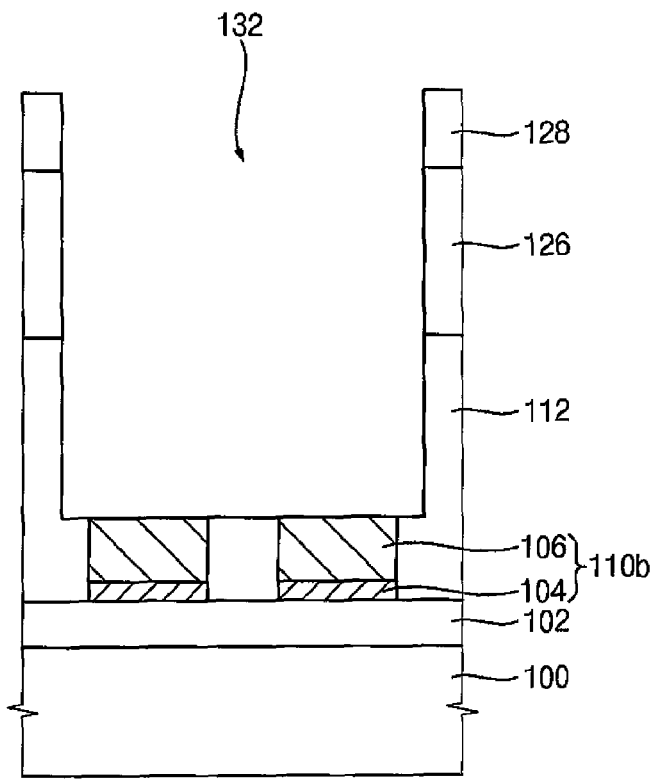
Figure 2C:
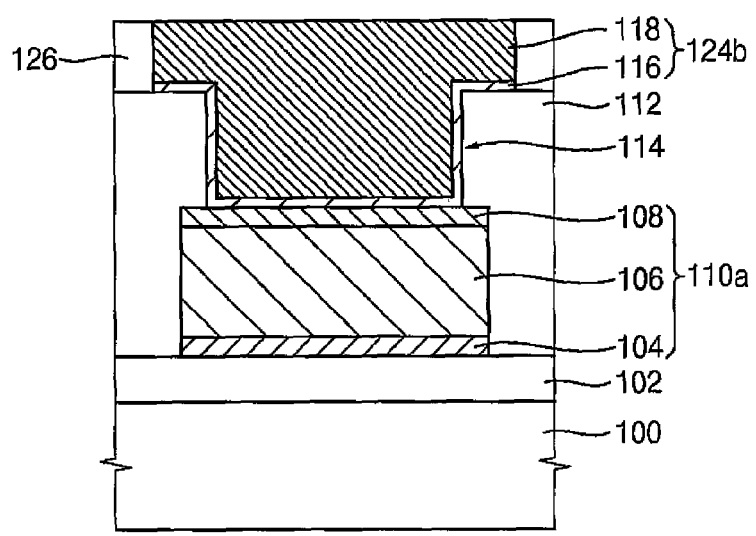

FIGS. 2A through 2C are cross-sectional views illustrating a semiconductor device according to one embodiment of the invention. More particularly, FIG. 2A illustrates a portion of the semiconductor device in which core and peripheral circuits are positioned; FIG. 2B illustrates a fuse area of the semiconductor device; and FIG. 2C illustrates a bonding pad area of the semiconductor device.

Referring to FIGS. 2A through 2C, a memory cell (not shown) or at least one wiring structure (not shown) is formed on a semiconductor substrate 100 such as a wafer. As an example, the wiring structure may include bit lines connected to the memory cell. The wiring structure includes a multilayer structure of metal wirings in which a plurality of metal wirings is stacked.

An insulation layer 102 is formed on substrate 100 with a sufficient thickness to cover the memory cell and the wiring structure. Insulation layer 102 typically comprises an oxide such as silicon oxide.

A first conductive structure 110a and a metal fuse 110b are formed on insulation layer 102. First conductive structure 110a typically makes electrical contact with a lower wiring structure such as a bit line or a metal wiring of the memory cell through a contact hole (not shown) formed through insulation layer 102.

First conductive structure 110a includes a first barrier layer 104, a first metal layer 106 formed on first barrier layer 104, and a first capping layer 108 formed on first metal layer 106.

As an example, it will be assumed that first conductive structure 110a is a next topmost metal wiring of the multilayer structure having a plurality of metal wirings. In this case, a top surface of metal fuse 110b is coplanar with that of a next topmost metal wiring and metal fuse 110b is positioned adjacent to a top surface of the semiconductor device. As a result, a slight increase in an electrical power of the laser is sufficient for repairing defective cells during the laser repair process. In addition, a distance between the laser and metal fuse 110b will be relatively short and an intermediate material between metal fuse 110b and the top surface of the semiconductor device will be relatively small, so the laser will be sufficiently prevented from diffusing.

First barrier layer 104 prevents silicon atoms of insulation layer 102 from diffusing into first metal layer 106 comprising aluminum (Al). Further, first barrier layer 104 makes ohmic contact with insulation layer 102 and improves an adhesion force between first metal layer 106 and insulation layer 102. As one example, barrier layer 104 may comprise titanium (Ti) or titanium nitride (TiN).

A first IMD layer 112 is formed on insulation layer 102 to a sufficient thickness to cover first conductive structure 110a and metal fuse 110b. As one example, first IMD layer 112 may comprise an oxide such as silicon oxide.

A second conductive structure is formed on first IMD layer 112. The second conductive structure includes a topmost metal wiring 124a of the multilayer structure of the metal wirings at the core/peripheral circuit portion of the semiconductor device, and a bonding pad 124b at the boning pad area of the semiconductor device. Second conductive structures 124a and 124b make electrical contact with first conductive structure 110a through a via hole 114 formed in first IMD layer 112.

Second conductive structures 124a and 124b include a second barrier layer 116 comprising titanium (Ti) or titanium nitride (TiN), a second metal layer 118 comprising aluminum (Al) and a second capping layer 120 comprising titanium (Ti) or titanium nitride (TiN).

Second conductive structures 124a and 124b may further include an etching prevention layer 122 stacked on second capping layer 120 at portions of the semiconductor device but not on the bonding pad area. Etching prevention layer 122 has an etching selectivity with respect to second metal layer 118. For example, etching prevention layer 122 may comprise silicon nitride. Where an etching process is performed against metal fuse 110b to reduce the thickness of metal fuse 110b after exposing the fuse area and the bonding pad area of the semiconductor device, etching prevention layer 122 prevents second metal layer 118 from being etched simultaneously with metal fuse 110b.

Etching prevention layer 122 and second capping layer 120 are removed from second conductive structure 124b in the bonding pad area of the semiconductor device, so that the bonding pad of the semiconductor device includes second barrier layer 116 and second metal layer 118. In contrast, etching prevention layer 122 still remains on second conductive structure 124a at portions of the semiconductor device other than the bonding pad area, e.g., at the core/peripheral circuit areas of the semiconductor device. That is, etching prevention layer 122 remains on the topmost metal wiring of the multilayer structure of the metal wiring.

A second IMD layer 126 is formed on first IMD layer 112 with a sufficient thickness to cover second conductive structures 124a and 124b. As one example, second IMD layer 126 may comprise silicon oxide. A third IMD layer 128 is formed on second IMD layer 126 and may comprise, e.g., silicon nitride. An opening 132 is formed through first IMD layer 128, second IMD layer 126, and first IMD layer 112. Metal fuse 110b and the bonding pad area are exposed through opening 132.

In the example of FIG. 2, etching prevention layer 122 minimizes the removal of metal layer 118 during an etching process for reducing the thickness of the metal fuse, so that metal layer 118 has a desired thickness. As a result, a plurality of balls are firmly adhered to the bonding pad in a package process for the semiconductor device, thereby minimizing bonding failures of the bonding pad.

Further, the metal fuse of the semiconductor device in FIG. 2 has a relatively small thickness, so that a relatively low power laser is sufficient for cutting the metal fuse connected to the defective cell of the semiconductor device in the laser repair process. Accordingly, damage to a neighboring metal fuse and semiconductor substrate 100 caused by the laser is substantially prevented in the laser repair process. The neighboring metal fuse is connected to a non-defective cell of the semiconductor device and is positioned adjacent to the metal fuse connected to the defective cell.

Figure 3A:
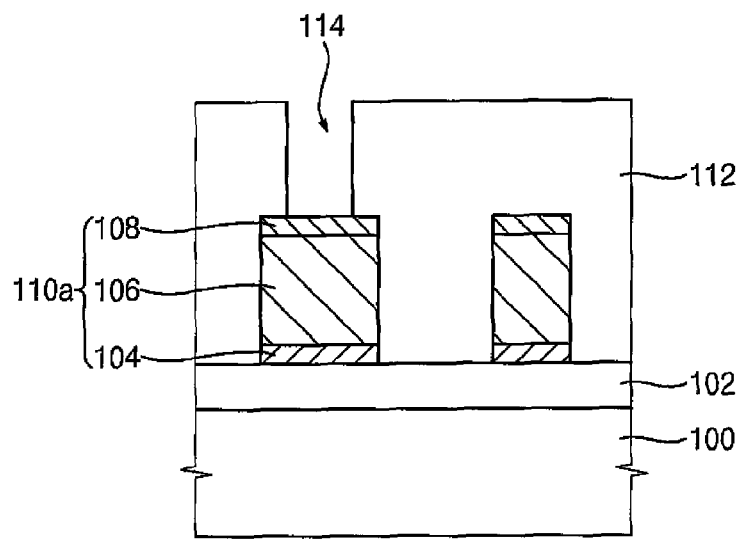
FIGS. 3A through 5C are cross-sectional views illustrating a method of manufacturing a semiconductor device according to one embodiment of the invention.
Figure 3B:
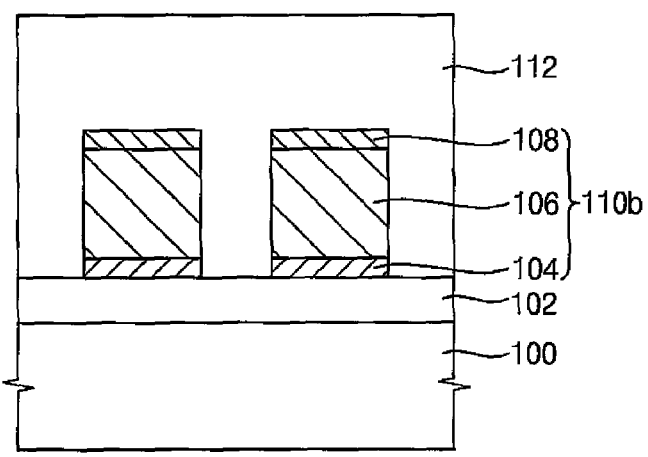
Figure 3C:
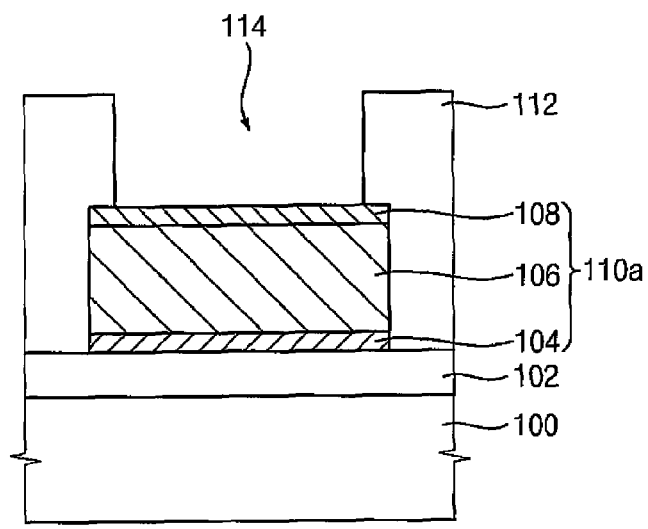
Figure 4A:
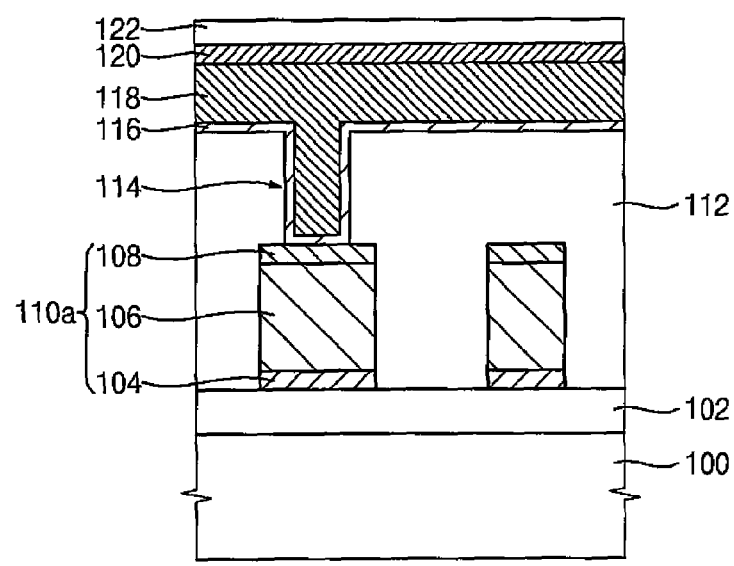
Figure 4B:
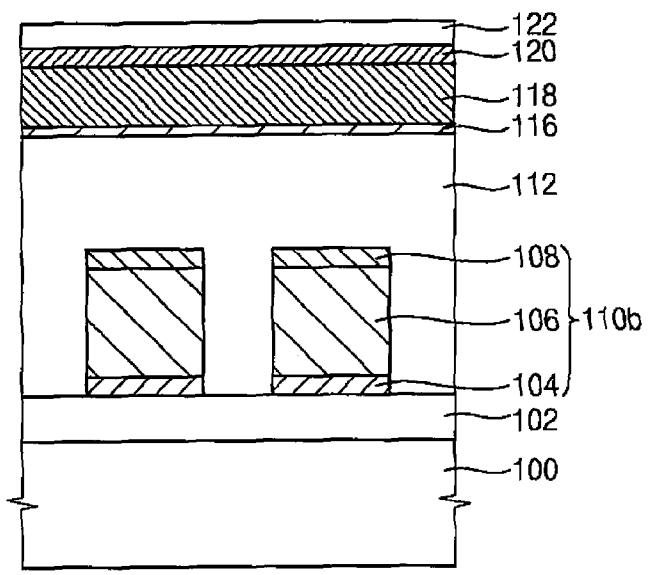
Figure 4C:
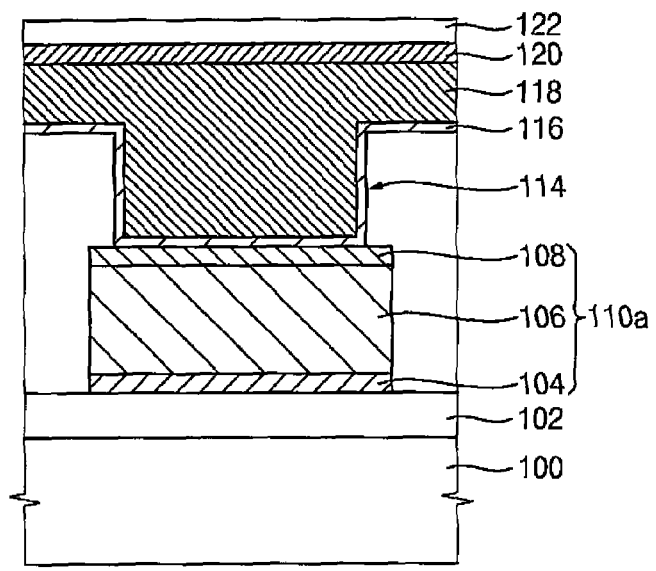
Figure 5A:
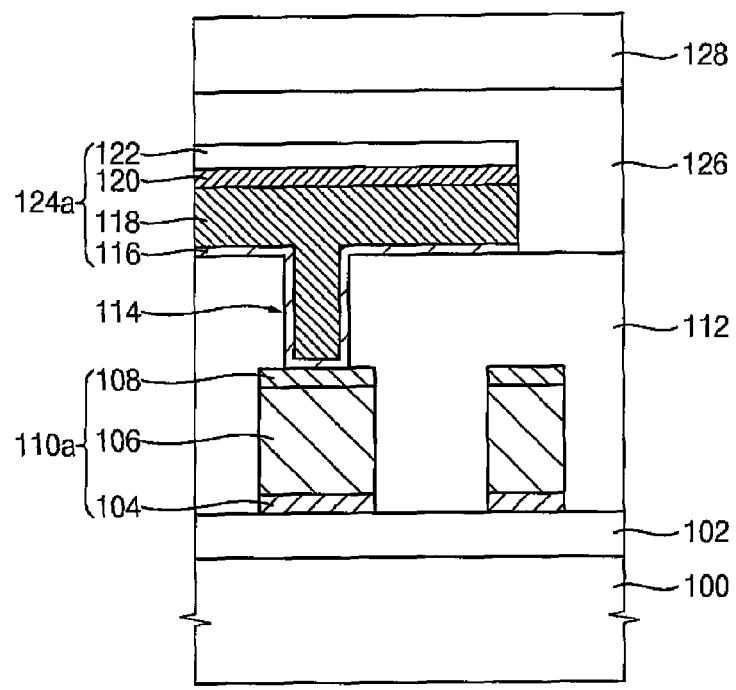
Figure 5B:
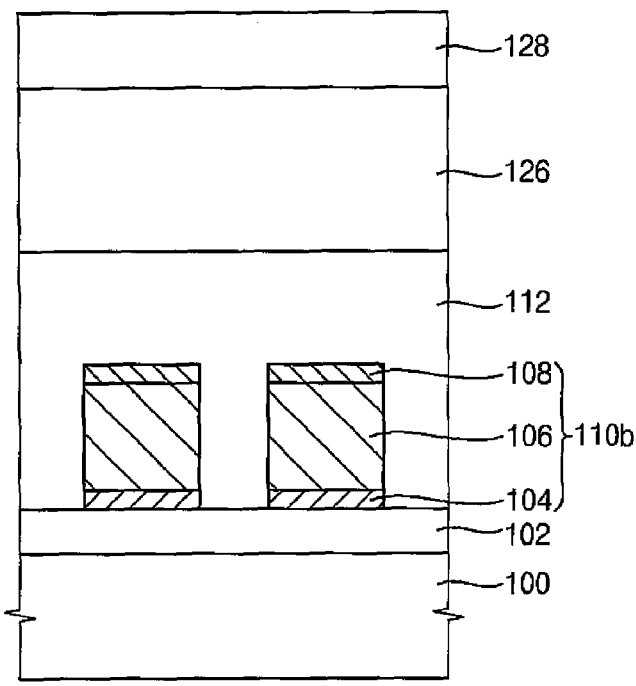
Figure 5C:
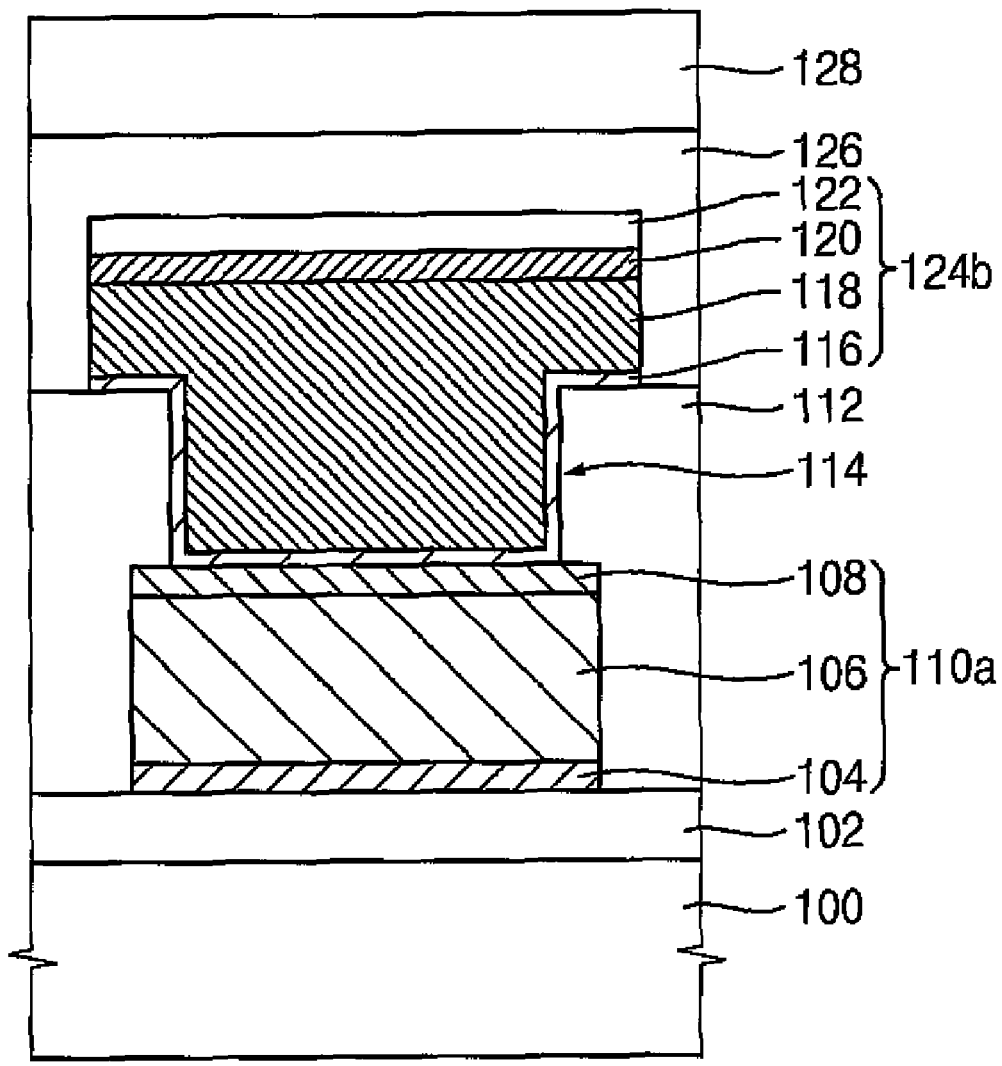

FIGS. 3A through 5C are cross-sectional views illustrating a method of manufacturing a semiconductor device according to one embodiment of the invention. More particularly, FIGS. 3A, 4A, and 5A illustrate a circuit area of the semiconductor device on which core and peripheral circuits are formed; FIGS. 3B, 4B, and 5B illustrate a fuse area of the semiconductor device on which a metal fuse is formed; and FIGS. 3C, 4C, and 5C illustrate a bonding pad area of the semiconductor device on which a bonding pad is formed.

FIGS. 3A through 3C illustrate steps for forming first conductive structure 110a and metal fuse 110b of the semiconductor device. A memory cell (not shown) or at least one wiring structure (not shown) is formed on semiconductor substrate 100. As an example, the wiring structure could include bit lines of the memory cell or a multilayer structure of metal wirings in which a plurality of metal wirings is stacked.

Insulation layer 102 is formed on substrate 100 to a sufficient thickness to cover the memory cell and the wiring structure by a deposition process such as a chemical vapor deposition (CVD) process, a plasma-enhanced CVD (PECVD) process, and a high density plasma CVD (HDP-CVD) process. Insulation layer 102 typically comprises an oxide such as silicon oxide.

First barrier layer 104 comprising titanium (Ti) or titanium nitride (TiN), first metal layer 106 comprising aluminum (Al) and first capping layer 108 comprising titanium (Ti) or titanium nitride (TiN) are sequentially formed on insulation layer 102 by a deposition process. Then, first capping layer 108, first metal layer 106 and first barrier layer 104 are sequentially patterned by a photolithography process to form first conductive structure 110a and metal fuse 110b. In the present example, first conductive structure 110a includes a next topmost metal layer of a multilayer structure in which a plurality of metal wirings is stacked.

First barrier layer 104 makes superior ohmic contact with insulation layer 102 because first barrier layer 104 comprises titanium (Ti), and insulation layer 102 comprises silicon (Si) and improves an adhesion force between first metal layer 106 and insulation layer 102. Titanium (Ti) of first barrier layer 104 may react with silicon (Si) of insulation layer 102 during a heat treatment such that undesirable byproducts are generated at a boundary surface between first barrier layer 104 and insulation layer 102, thereby increasing a contact resistance at the boundary surface. For that reason, a titanium nitride (TiN) layer, which is less reactive with silicon, may be interposed between the titanium (Ti) layer and the aluminum (Al) layer. In other words, first barrier layer 104 may include a first sublayer comprising titanium (Ti) and a second sublayer comprising titanium nitride (TiN).

Capping layer 108 prevents first metal layer 106 comprising aluminum (Al) from oxidizing, so that first metal layer 106 is sufficiently protected from its environment by capping layer 108.

The titanium layer in first barrier layer 104 and first capping layer 108 is formed to a thickness less than or equal to about 100 Å, and the titanium nitride layer in first barrier layer 104 and first capping layer 108 is formed to a thickness of about 100 Å to about 200 Å. First metal layer 106 comprising aluminum (Al) is formed to a thickness of about 4,000 Å to about 5,000 Å.

Before the first barrier layer is formed on insulation layer 12, insulation layer 102 is etched to form a contact hole through which a bit line of a memory cell or a lower metal wiring is exposed. The contact hole may be filled with conductive material to form a contact plug in the contact hole. First conductive structure 110a is electrically connected to the bit line of the memory cell or the lower metal wirings through the contact plug.

Thereafter, first IMD layer 112 is formed on insulation layer 102 to a thickness sufficient to cover first conductive structure 110a and metal fuse 110b. First IMD layer 102 is generally formed by a deposition process such as a CVD process, a PECVD process and a HDP-CVD process. First IMD layer 112 typically comprises an oxide such as silicon oxide.

First IMD layer 112 is partially removed by a photolithography process to form a via hole 114 through which first conductive structure 110a is partially exposed.

Referring to FIGS. 4A through 4C, second barrier layer 116 comprising titanium (Ti) or titanium nitride (TiN) is formed on a surface of first IMD layer 112 and a sidewall and a bottom of via hole 114, and second metal layer 118 comprising aluminum (Al) is formed on second barrier layer 116. Second capping layer 120 is formed on second metal layer 118, and etching prevention layer 122 is formed on second capping layer 120. Second capping layer 120 may comprise titanium (Ti) or titanium nitride (TiN).

Etching prevention layer 122 has an etching selectivity with respect to second metal layer 118. For example, etching prevention layer 122 may comprise silicon nitride. A PECVD process or a lower pressure CVD (LPCVD) process at a relatively low temperature may be performed for forming etching prevention layer 122.

When an etching process is performed against metal fuse 110b for reducing the thickness of metal fuse 110b after exposing the fuse area and the bonding pad area of the semiconductor device, etching prevention layer 122 prevents second metal layer 118 from being etched simultaneously with metal fuse 110b. The thickness of etching prevention layer 122 varies in accordance with a target thickness of metal layer 106 in metal fuse 110b. For example, where first metal layer 106 is formed to a thickness of about 5,000 Å and the target thickness of first metal layer 106 in metal fuse 110b is about 3,000 Å, etching prevention layer 122 is formed to a thickness of about 1,500 Å to about 2,000 Å, which is near to an amounts of first metal layer 106 to be etched. Thus, second metal layer 118 is sufficiently prevented from being etched off during the etch process against first metal layer 106 by etch protection layer 122.

The titanium layer in second barrier layer 116 and second capping layer 120 is typically formed to a thickness less than or equal to about 100 Å, and the titanium nitride layer in second barrier layer 116 and second capping layer 120 is typically formed to a thickness of about 100 Å to about 200 Å. Second metal layer 118 comprising aluminum (Al) is formed to a thickness of about 4,000 Å to about 5,000 Å.

FIGS. 5A through 5C illustrate steps for forming a second conductive structure by patterning second barrier layer 116, second metal layer 118, second capping layer 120 and etching prevention layer 122 using a photolithography process. The second conductive structure includes topmost metal wiring 124a of the multilayer structure including the plurality of metal wirings and bonding pad 124b of the semiconductor device.

The second conductive structure is electrically connected to first conductive structure 110a through via hole 114 of first IMD layer 112.

Second IMD layer 126 is formed on first IMD layer 112 with a sufficient thickness to cover the second conductive structure. Second IMD layer 126 comprises an oxide such as silicon oxide.

A nitride such as silicon nitride is deposited onto second IMD layer 126 to form third IMD layer 128 on second IMD layer 126. Third IMD layer 128 functions as a hard mask for first and second IMD layers 112 and 126 comprising silicon oxide in a subsequent etching process for exposing the fuse area and the bonding pad area of the semiconductor device.

A photoresist layer (not shown) is formed on third IMD layer 128 and is patterned into a photoresist pattern (not shown) by an exposure process and development process. The photoresist pattern defines the fuse area and the bonding pad area. Then, third IMD layer 128, second IMD layer 126 and first IMD layer 112 are sequentially and partially removed by an etching process using the photoresist pattern as an etching mask, to form an opening 132 through which both of the fuse area and the bonding pad area are simultaneously exposed as shown in FIGS. 2A through 2C.

First and second IMD layers 126 and 112 comprising silicon oxide are formed with a thickness of about 25,000 Å so that the photoresist pattern is not sufficient for the etch mask in the etching process for forming opening 132. As a result, first and second IMD layers 126 and 112 may be removed by an etching process using third IMD layer 128 as an etch mask, because third IMD layer 128 comprises silicon nitride having an etch selectivity with respect to silicon oxide.

After opening 132 is formed, metal fuse 110b is partially etched until metal layer 106 of metal fuse 100b remains with a thickness of about 3,000 Å. As a result, metal fuse 110b includes first barrier layer 104 and first metal layer 106 as shown in FIG. 2B.

Metal fuse 100b is etched to a sufficiently small thickness so that metal fuse 100b in the defective cell can be readily cut in a laser repair process. Further, a relatively low power laser beam is sufficient for cutting off the metal fuse connected to the defective cell of the semiconductor device in the laser repair process. Accordingly, a neighboring metal fuse and semiconductor substrate 100 are sufficiently prevented from damages caused by the laser during the laser repair process. The neighboring metal fuse is connected to a non-defective cell of the semiconductor device and is positioned adjacent to the metal fuse connected to the defective cell.

Second conductive structure 124b in the bonding pad area is etched simultaneously with metal fuse 110b, because both of the bonding pad area and the fuse area are exposed through opening 132. However, etching prevention layer 122, which is formed on a top surface of second conductive structure 124b, prevents second metal layer 118 from being etched in the etching process against metal fuse 110b. As a result, metal layer 118 is substantially un-etched in the etching process against first metal layer 106. In contrast, etching prevention layer 122 and second capping layer 120 are sufficiently etched off when performing the same etching process against first metal layer 118.

Accordingly, second conductive structure 124b in the bonding pad area, which is a bonding pad of the semiconductor device, includes second barrier layer 116 and second metal layer 118. In addition, second conductive structure 124a in other areas in the semiconductor device, e.g., core/peripheral circuit area, which is the topmost metal wiring of the semiconductor device, still includes etching prevention layer 122 on a top surface thereof.

After completing an etching process against an upper portion of metal fuse 110b, the photoresist pattern is removed from third IMD layer 128 by an ashing process and a stripping process. Thereafter, a polyimide layer is formed on substrate 100 to form a passivation layer. The passivation layer is then patterned by a photolithography process to open the bonding pad area.

Figure 6A:
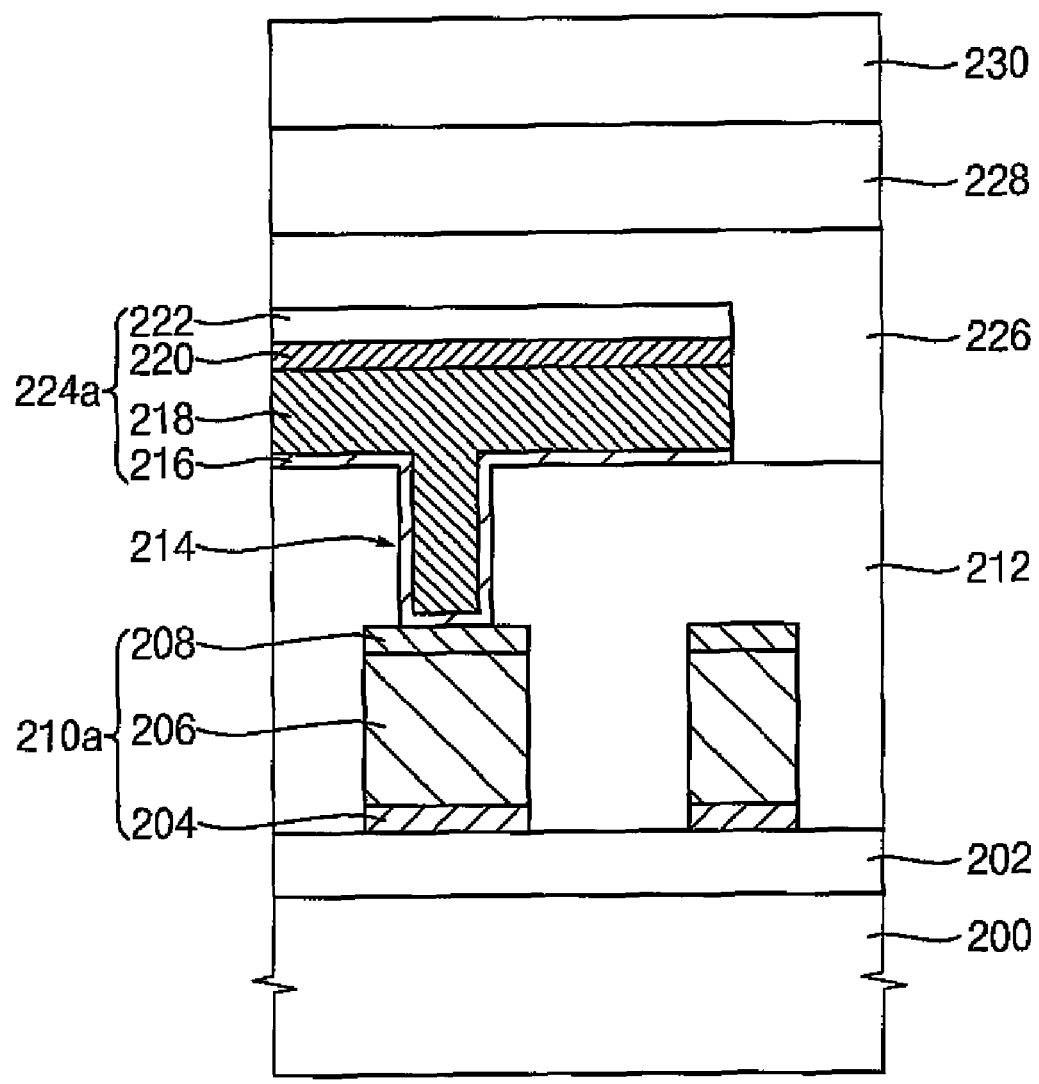
FIGS. 6A through 7C are cross-sectional views illustrating a method of manufacturing a semiconductor device according to another embodiment of the invention.
Figure 6B:
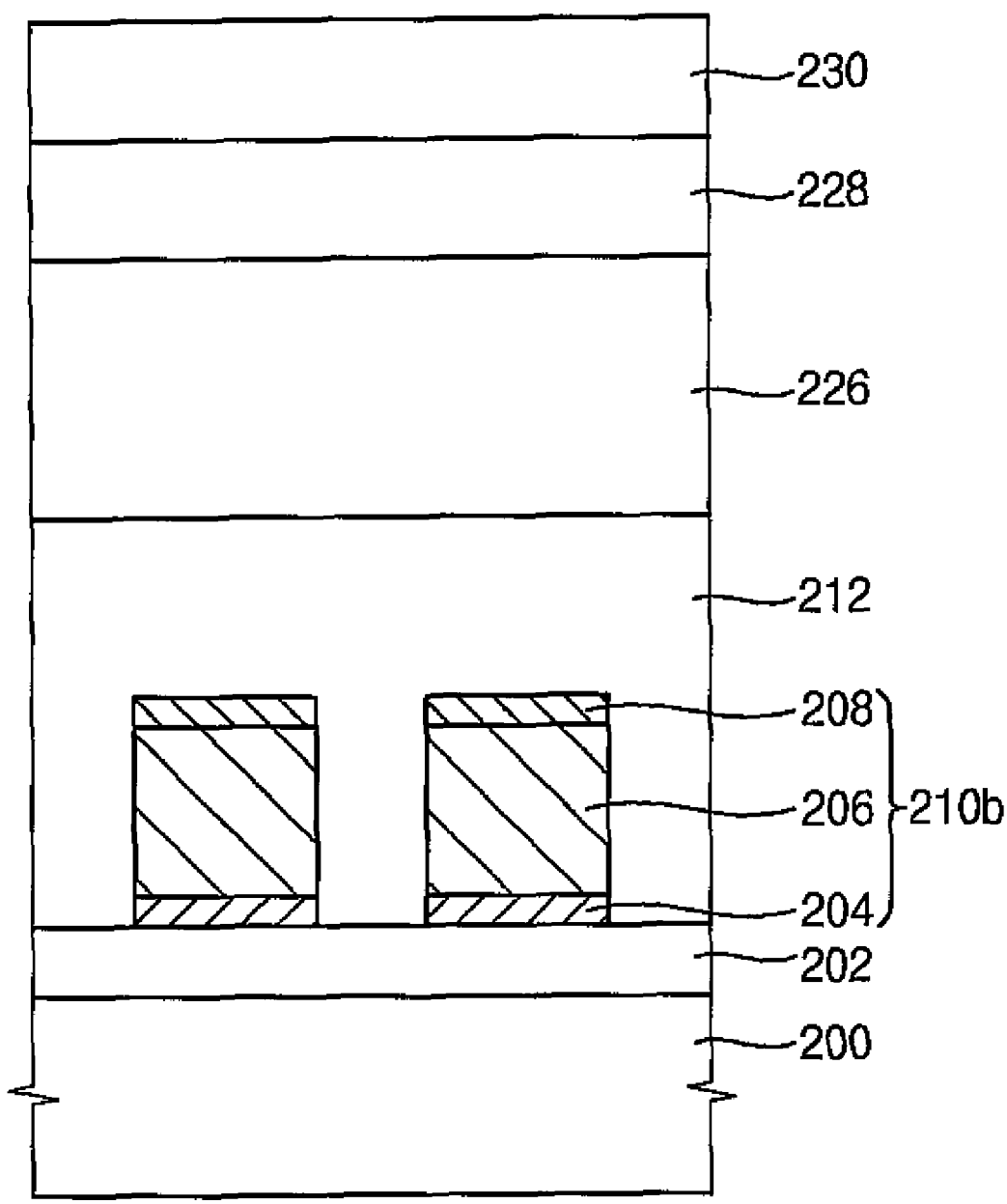
Figure 6C:
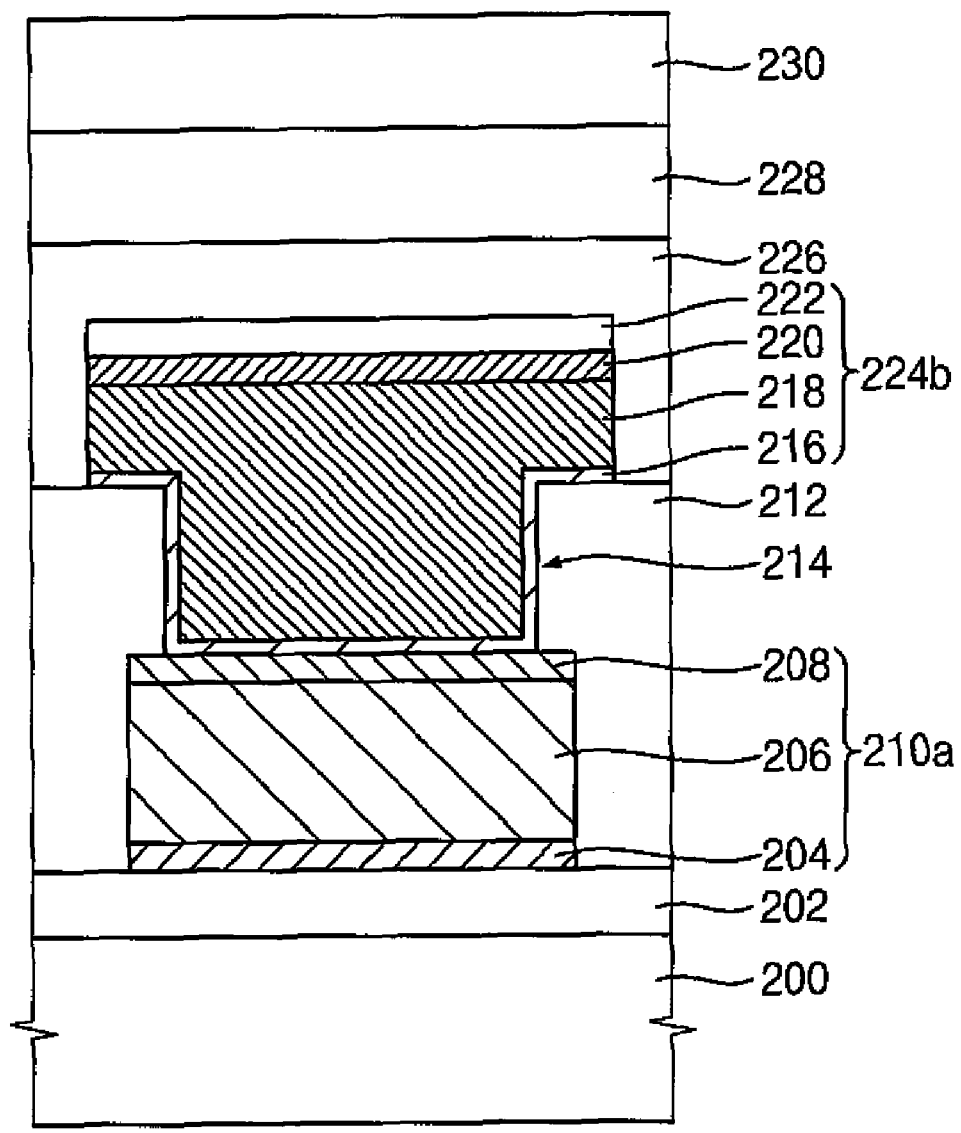
Figure 7A:
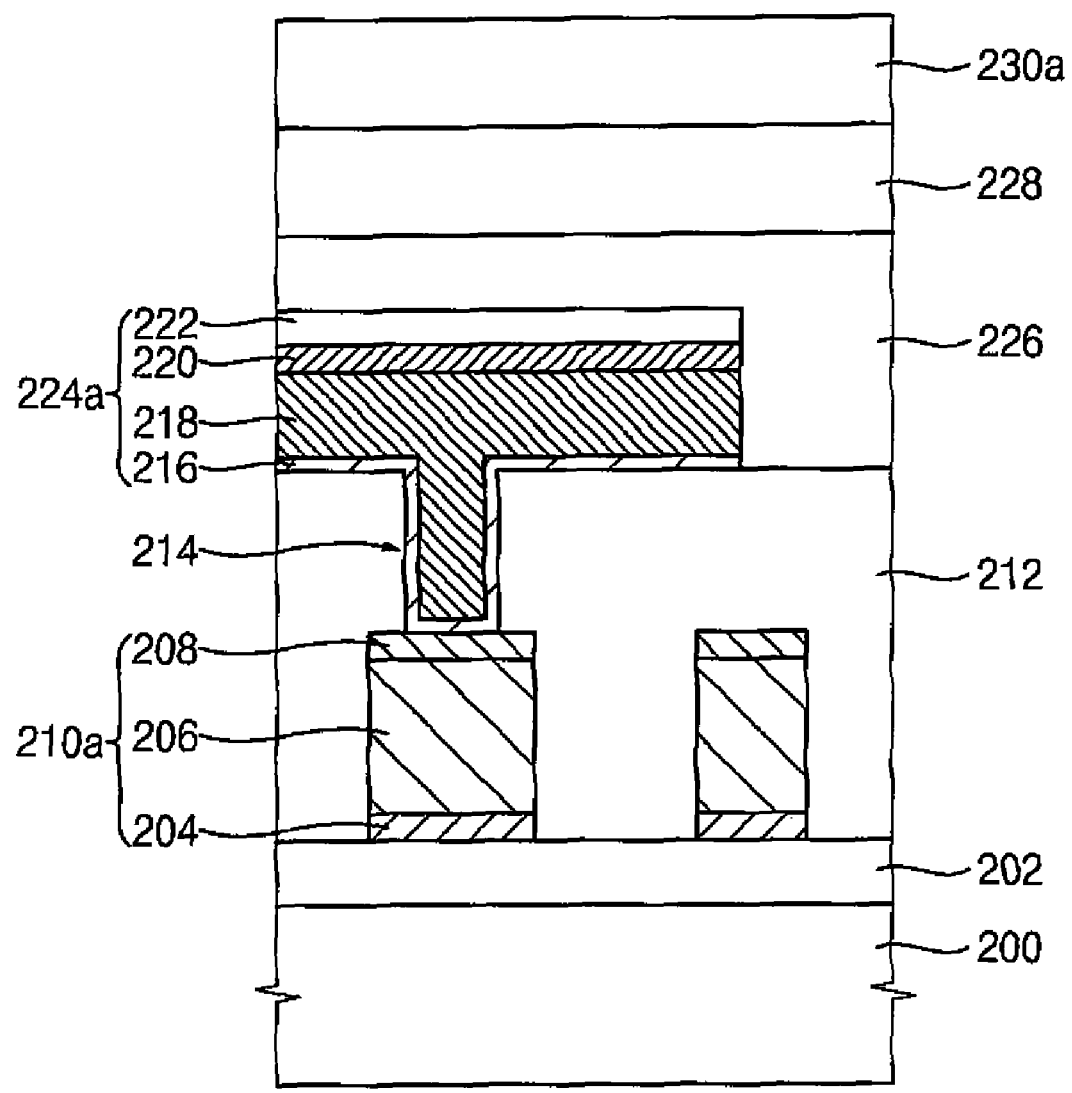
Figure 7B:
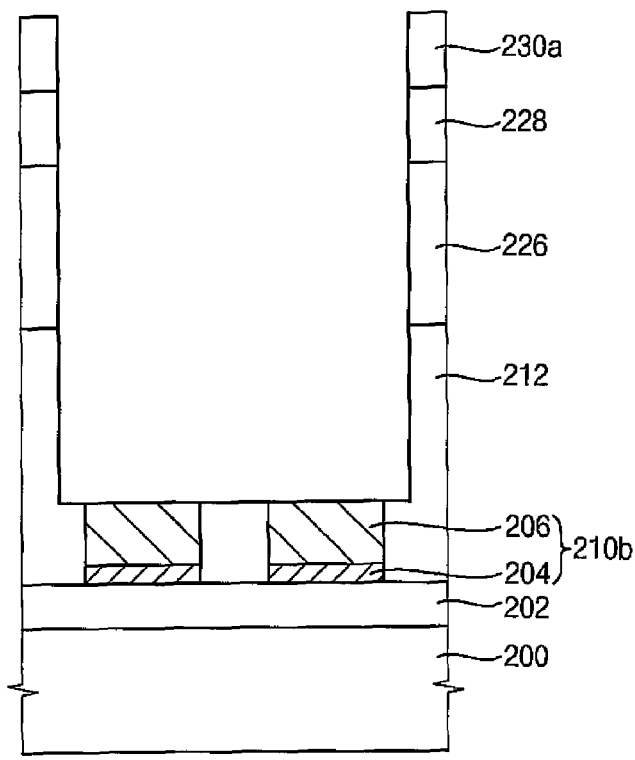
Figure 7C:
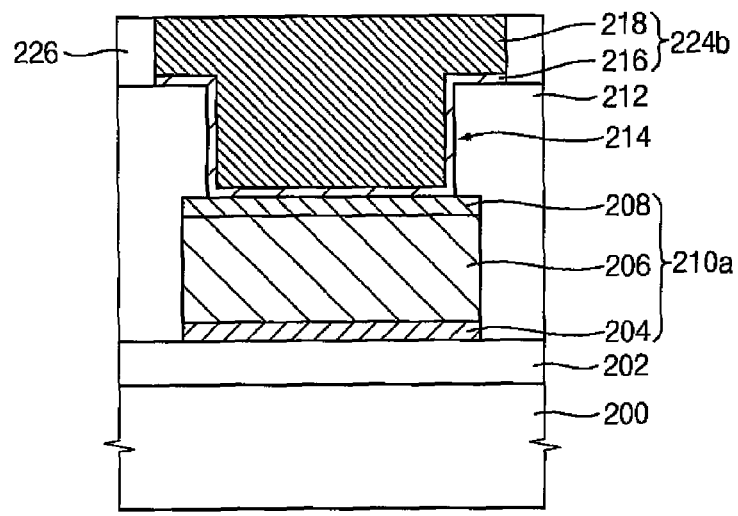

FIGS. 6A through 7C are cross-sectional views illustrating a method of manufacturing a semiconductor device according to another embodiment of the invention. More particularly, FIGS. 6A and 7A illustrate a circuit area of the semiconductor device on which core and peripheral circuits are formed; FIGS. 6B and 7B illustrate a fuse area of the semiconductor device on which a metal fuse is formed; and FIGS. 6C and 7C illustrate a bonding pad area of the semiconductor device on which a bonding pad is formed.

Referring to FIGS. 6A through 6C, a memory cell (not shown) or at least one wiring structure (not shown) is formed on a semiconductor substrate 200 such as a wafer, and an insulation layer 202 is formed on substrate 200 by the same process used to form insulation 102 as described with reference to FIGS. 3A through 3C. A first conductive structure 210a and a metal fuse 210b are formed on insulation layer 202 by the same process used to form first conductive structure 110a and metal fuse 110b as described with reference to FIGS. 3A through 3C. First conductive structure 210a functions as a next topmost metal wiring of a multilayer structure in which a plurality of metal wirings is stacked.

First conductive structure 210a and metal fuse 210b include a first barrier layer 204 comprising titanium (Ti) or titanium nitride (TiN), a first metal layer 206 comprising aluminum (Al), and a first capping layer 208 comprising titanium (Ti) or titanium nitride (TiN).

A first IMD layer 212 is formed on insulation layer 202 with a thickness sufficient to cover first conductive structure 210a and metal fuse 210b. First IMD layer 212 is then partially removed by a photolithography process to form a via hole 214 through which first conductive structure 210a is partially exposed.

A second barrier layer 216 comprising titanium (Ti) or titanium nitride (TiN) is formed on a surface of first IMD layer 212 and a sidewall and a bottom of via hole 214, and a second metal layer 218 comprising aluminum (Al) is formed on second barrier layer 216. A second capping layer 220 is formed on metal layer 218, and an etching prevention layer 222 is formed on second capping layer 220. Second capping layer 220 may comprise titanium (Ti) or titanium nitride (TiN).

Etching prevention layer 222 typically has an etching selectivity with respect to metal layer 218. For example, etching prevention layer 222 may comprise silicon nitride.

Etching prevention layer 222, capping layer 220, metal layer 218, and second barrier layer 216 are sequentially patterned using a photolithography process to form a second conductive structure. The second conductive structure includes a topmost metal wiring 224a of the multilayer structure of the metal wirings and a bonding pad 224b. Second conductive structure 224a/224b is electrically connected to first conductive structure 210a through via hole 214 of first IMD layer 212.

A second IMD layer 226 is formed on first IMD layer 212 with a thickness sufficient to cover second conductive structure 224a/224b. Second IMD 226 typically comprises an oxide such as silicon oxide. A nitride such as silicon nitride is deposited onto second IMD layer 226 to thereby form a third IMD layer 228 on second IMD layer 226.

Thereafter, a passivation layer 230 comprising photosensitive polyimide is formed on third IMD layer 228 by a spin-coating process.

Referring to FIGS. 7A through 7C, an exposure process and a development process are performed on passivation layer 230 to form a passivation pattern 230a defining the fuse area and the bonding pad area.

Non-photosensitive polyimide requires an additional photoresist layer to perform a photolithographic patterning process. However, the photosensitive polyimide is directly reacted with an illumination light, so passivation layer 230 may be patterned into passivation pattern 230a by an exposure process and a development process without an additional photoresist layer.

Third IMD layer 228, second IMD layer 226 and first IMD layer 212 are sequentially and partially removed by an etching process using passivation pattern 230a as an etching mask to form an opening 232 through which both of the fuse area and the bonding pad area are simultaneously exposed.

Metal fuse 210b is partially etched until metal layer 206 of metal fuse 210b remains with a thickness of about 3,000 Å. As a result, metal fuse 210b includes the first barrier layer 204 and the first metal layer 206.

Second conductive structure 224b in the bonding pad area is etched simultaneously with metal fuse 210b, because both of the bonding pad area and the fuse area are exposed through opening 232. However, etching prevention layer 222, which is formed on a top surface of second conductive structure 224b, prevents metal layer 218 from being etched in the etching process against metal fuse 210b. As a result, metal layer 218 is substantially un-etched during the etching process of first metal layer 206 due to etching prevention layer 222. On the other hand, etching prevention layer 222 and second capping layer 220 are sufficiently etched during the same etching process.

Accordingly, second conductive structure 224b in the bonding pad area, which is a bonding pad of the semiconductor device, includes second barrier layer 216 and metal layer 218. Second conductive structure 224a in areas of the semiconductor device other than the bonding pad area, e.g., core/peripheral circuit area, which is the topmost metal wiring of the semiconductor device, still includes etching prevention layer 222 on a top surface thereof.

The passivation pattern comprising photosensitive polyimide is used as an etch mask for forming an opening 232 through which the fuse area and the bonding pad area are exposed. Therefore, opening 232 is continuously formed subsequent to the passivation pattern, using the same exposure process as the passivation pattern and without requiring an additional photoresist pattern. Accordingly, the manufacturing process for the semiconductor device is simplified.

The first conductive structure functioning as the metal wiring and the metal fuse is formed on the substrate using the first metal layer. The second conductive structure including the second metal layer and the etching prevention layer is formed on the resultant structure including the first conductive structure. The second conductive structure functions as a metal wiring and a bonding pad in the semiconductor device.

Both of the fuse area and the bonding pad area are exposed through the same opening, and the metal fuse is partially etched until it has a relatively small thickness. The etching prevention layer of the second conductive structure at the bonding pad area prevents the second metal layer being etched in the etching process to the metal fuse.

Accordingly, a loss of the metal layer of the bonding pad is minimized in the etching process against the metal fuse, so that the bonding pad has a sufficient thickness of the metal layer despite the etching process. As a result, an adhesion force between balls bonded to the bonding pad in a subsequent ball bonding process is improved, thereby minimizing ball bonding failures.

The foregoing exemplary embodiments are teaching examples. Those of ordinary skill in the art will understand that various changes in form and details may be made to the exemplary embodiments without departing from the scope of the invention as defined by the following claims.

What is claimed:

1. A semiconductor device, comprising:
   a semiconductor substrate having a bonding pad area and a fuse area;
   a first conductive structure formed on the substrate, the first conductive structure having a thickness and a top surface and comprising a first metal layer;
   a metal fuse formed on the substrate in the fuse area, the metal fuse having a thickness smaller than the thickness of the first conductive structure and a top surface coplanar with the top surface of the first conductive structure;
   a first inter-metal dielectric (IMD) layer covering the first conductive structure and the metal fuse;
   a via hole formed through the first IMD layer such that the first conductive structure is partially exposed through the via hole;
   a second conductive structure formed on the first IMD layer over the substrate and electrically connected to the first conductive structure through the via hole, the second conductive structure comprising a second metal layer and an etching prevention layer formed over the second metal layer on areas of the substrate other than the bonding pad area but not in the bonding pad area; and
   a second IMD layer formed on the first IMD layer, the second IMD layer covering the second conductive structure and comprising an opening through which the fuse area and the bonding pad area are exposed through the first IMD layer.

2. The device of claim 1, wherein the etching prevention layer has an etching selectivity with respect to the second metal layer.

3. The device of claim 2, wherein the etching prevention layer comprises silicon nitride.

4. The device of claim 1, wherein the second conductive structure comprises a topmost metal wiring of a multilayer structure in which a plurality of metal wirings is stacked.

5. The device of claim 1, further comprising at least one wiring structure formed between the first conductive structure and the substrate.

6. The device of claim 5, wherein the first conductive structure is electrically connected to the at least one wiring structure.

7. The device of claim 1, wherein the first conductive structure comprises a first barrier layer formed below the first metal layer and a first capping layer formed on the first metal layer, and the metal fuse comprises the first barrier layer and the first metal layer.

8. The device of claim 1, wherein the second conductive structure further comprises a second barrier layer formed below the second metal layer.

9. The device of claim 1, wherein the second conductive structure further comprises a second capping layer between the second metal layer and the etching prevention layer.

* * * * *